(12) United States Patent
Yoshida et al.

(10) Patent No.: US 9,153,326 B2
(45) Date of Patent: Oct. 6, 2015

(54) NONVOLATILE SEMICONDUCTOR MEMORY DEVICE AND METHOD OF CONTROLLING SAME

(71) Applicant: KABUSHIKI KAISHA TOSHIBA, Minato-ku (JP)

(72) Inventors: Masashi Yoshida, Yokohama (JP); Eietsu Takahashi, Yokkaichi (JP); Yasuhiro Shiino, Fujisawa (JP); Nobushi Matsuura, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 103 days.

(21) Appl. No.: 14/017,641

(22) Filed: Sep. 4, 2013

(65) Prior Publication Data

US 2014/0241058 A1    Aug. 28, 2014

(30) Foreign Application Priority Data

Feb. 26, 2013   (JP) ................. 2013-036022

(51) Int. Cl.
*G11C 16/06* (2006.01)
*G11C 16/10* (2006.01)
*G11C 11/56* (2006.01)
(Continued)

(52) U.S. Cl.
CPC ............ *G11C 16/10* (2013.01); *G11C 11/5628* (2013.01); *G11C 16/0483* (2013.01); *G11C 16/3427* (2013.01); *G11C 16/3459* (2013.01)

(58) Field of Classification Search
CPC ........... G11C 16/0483; G11C 16/3418; G11C 16/3459

USPC ................................................... 365/185.03
See application file for complete search history.

(56) References Cited

U.S. PATENT DOCUMENTS 6,243,290 B1    6/2001   Kurata et al.
8,315,104 B2 *  11/2012  Futatsuyama et al. ... 365/185.22
(Continued)

FOREIGN PATENT DOCUMENTS

JP    2001-67884    3/2001
JP    2007-141447   6/2007
(Continued)

OTHER PUBLICATIONS

Office Action issued Jun. 23, 2015 in Japanese Patent Application No. 2013-036022 (with English translation).

*Primary Examiner* — J. H. Hur
*Assistant Examiner* — Xiaochun L Chen
(74) *Attorney, Agent, or Firm* — Oblon, McClelland, Maier & Neustadt, L.L.P.

(57) ABSTRACT

The disclosure describes a semiconductor memory device including a memory cell array and a control circuit. The memory cell array comprises a plurality of memory cells that each include a control gate and a charge accumulation layer and that each are configured to have a threshold set to be included in any of a plurality of threshold distributions, the memory cell being connected between a bit line and a source line. The control circuit, in at least one of a write verify operation and a read operation on a selected memory cell, applies to the control gate a control gate voltage to determine the threshold of the selected memory cell, the control gate voltage having a plurality of values respectively corresponded to the plurality of threshold distributions, and sets a voltage between the bit line and the source line based on the control gate voltage.

7 Claims, 10 Drawing Sheets

(51) Int. Cl.
*G11C 16/04* (2006.01)
*G11C 16/34* (2006.01)

(56) References Cited

U.S. PATENT DOCUMENTS

| | | | |
|---|---|---|---|
| 8,325,545 | B2 | 12/2012 | Edahiro |
| 8,472,259 | B2 | 6/2013 | Futatsuyama et al. |
| 8,711,635 | B2 * | 4/2014 | Futatsuyama et al. ... 365/185.22 |
| 2009/0323432 | A1 * | 12/2009 | Futatsuyama et al. ... 365/185.22 |
| 2013/0010541 | A1 * | 1/2013 | Futatsuyama et al. ... 365/185.22 |

FOREIGN PATENT DOCUMENTS

| | | |
|---|---|---|
| JP | 2010-9733 | 1/2010 |
| JP | 2011-530776 | 12/2011 |
| JP | 2012-14816 | 1/2012 |
| JP | 2012-84207 | 4/2012 |

\* cited by examiner

NONVOLATILE SEMICONDUCTOR MEMORY DEVICE AND METHOD OF CONTROLLING SAME

CROSS-REFERENCE TO RELATED APPLICATIONS

This application is based upon and claims the benefit of priority from the prior Japanese Patent Application No. 2013-36022, filed on Feb. 26, 2013, the entire contents of which are incorporated herein by reference.

FIELD

Embodiments described here relate to, for example, a nonvolatile semiconductor memory device and a method of controlling the same.

BACKGROUND

Description of the Related Art

A memory cell configuring a nonvolatile semiconductor memory device such as a NAND type flash memory and a NOR type flash memory includes a control gate and a charge accumulation layer and changes its threshold voltage according to a charge accumulated in the charge accumulation layer to store a magnitude of this threshold voltage as data. In recent years, a rise in density level and a further increase in storage capacity of the memory cell are proceeding in such a nonvolatile semiconductor memory device. One method being promoted to achieve an increase in storage capacity is multi-bit-per-cell technology where one memory cell stores multiple bits of data. In the case of promoting such multi-bit-per-cell technology, it is required to narrow as much as possible a threshold distribution specifying one data, in order to increase reliability of read data. However, the rise in density level of the memory cell increases variation in characteristics of the memory cell and increases effects of an adjacent memory cell, and these are factors that contribute to broadening the threshold distribution.

DETAILED DESCRIPTION

A nonvolatile semiconductor memory device according to an embodiment includes a memory cell array and a control circuit. The memory cell array comprises a plurality of memory cells that each include a control gate and a charge accumulation layer. Additionally, each memory cells are configured to have a threshold set to be included in any of a plurality of threshold distributions and thereby store multiple bits of data. The memory cell is connected between a bit line and a source line, and the control gate of the memory cell is connected to a word line. The control circuit, in at least one of a write verify operation and a read operation on a selected memory cell, applies to the word line a control gate voltage. The control gate voltage is applied to determine the threshold of the selected memory cell. The control gate voltage has a plurality of values respectively corresponded to the plurality of threshold distributions. The control circuit sets a voltage between the bit line and the source line to which the selected memory cell is connected, based on the control gate voltage.

A semiconductor memory device according to embodiments of the present invention is described below with reference to the drawings.

First Embodiment

Overall Configuration

Figure 1:
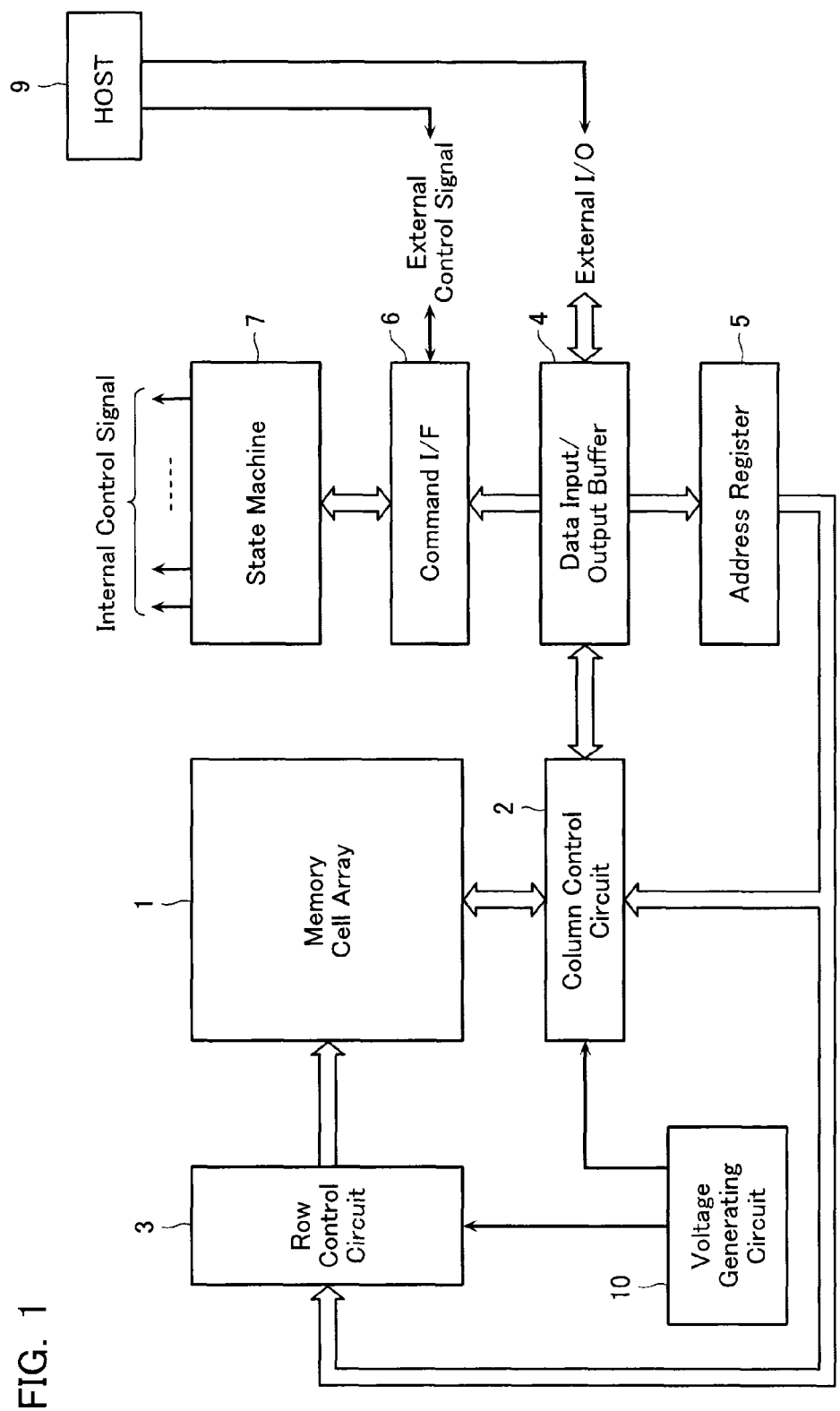
FIG. 1 is a block diagram showing a configuration of a nonvolatile semiconductor memory device according to a first embodiment.

FIG. 1 is a block diagram of a nonvolatile semiconductor memory device according to a first embodiment of the present invention. This nonvolatile semiconductor memory device includes a memory cell array 1 having a plurality of memory cells MC arranged in a matrix therein, and comprising a bit line BL and a word line WL disposed orthogonally to each other and connected to these memory cells MC. Provided in a periphery of this memory cell array 1 are a column control circuit 2 and a row control circuit 3. The column control circuit 2 controls voltage of the bit line BL to perform data erase of the memory cells MC, data write to the memory cells MC, and data read from the memory cells MC. The row control circuit 3 selects the word line WL to apply a voltage for data erase of the memory cells MC, data write to the memory cells MC, and data read from the memory cells MC.

A data input/output buffer 4 is connected to an external host 9, via an I/O line, to receive write data, receive an erase command, output read data, and receive address data or command data. The data input/output buffer 4 sends received write data to the column control circuit 2, receives data read from the column control circuit 2 and output the read data to external. An address supplied to the data input/output buffer 4 from external is sent to the column control circuit 2 and the row control circuit 3 via an address register 5.

Moreover, a command supplied to the data input/output buffer 4 from the host 9 is sent to a command interface 6. The command interface 6 receives an external control signal from the host 9 to determine whether data inputted to the data input/output buffer 4 is write data or a command or an address. Additionally, if the data inputted to the data input/output buffer 4 is a command, the command interface 6 receives the data and transfers the data to a state machine 7 as a command signal.

The state machine 7 performs management of this nonvolatile memory overall, and receives a command from the host 9, via the command interface 6, to perform management of read, write, erase, input/output of data, and so on.

In addition, it is also possible for status information managed by the state machine 7 to be received by the external host 9, thereby enabling the external host 9 to judge an operation result. Moreover, this status information can be utilized also in control of write and erase.

Furthermore, the state machine 7 controls a voltage generating circuit 10. This control enables the voltage generating circuit 10 to output a pulse of any voltage value and any timing.

Now, the pulse formed by the voltage generating circuit 10 can be transferred to any line selected by the column control circuit 2 and the row control circuit 3. These column control circuit 2, row control circuit 3, state machine 7, and voltage generating circuit 10, and so on, configure a control circuit of the nonvolatile semiconductor memory device in the present embodiment.

Memory Cell Array

Figure 2:
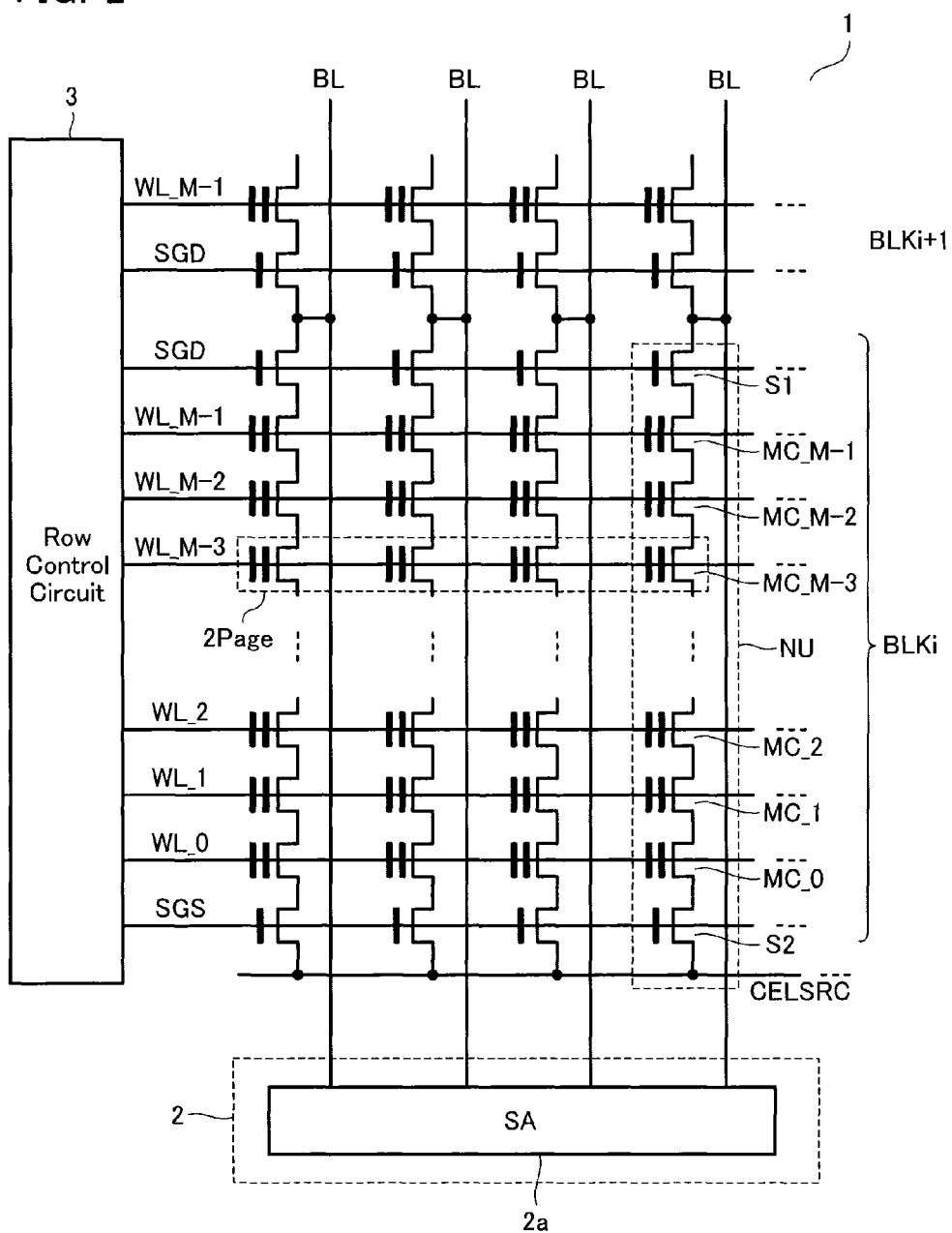
FIG. 2 is a circuit diagram showing a configuration of part of a memory cell array in same nonvolatile semiconductor memory device.

FIG. 2 is a circuit diagram showing a configuration in the case where the memory cell array 1 is of a NAND type. As shown in FIG. 2, the memory cell array 1 is configured having NAND cell units NU arranged therein. Each of the NAND cell units NU is configured having select gate transistors S1 and S2 respectively connected to both ends of a NAND string. The NAND string has M electrically rewritable nonvolatile memory cells MC_0~MC_M−1 connected in series therein, sharing a source and a drain. Note that here, M is, for example, 8, 16, 32, 33, 34, 64, 66, 68, 88, and so on.

The NAND cell unit NU has one end (a select gate transistor S1 side) connected to the bit line BL and the other end (a select gate transistor S2 side) connected to a common source line CELSRC. Gate electrodes of the select gate transistors S1 and S2 are connected to select gate lines SGD and SGS. In addition, control gate electrodes of the memory cells MC_0~MC_M−1 are respectively connected to word lines WL_0~WL_M−1. The bit line BL is connected to a sense amplifier 2a of the column control circuit 2, and the word lines WL_0~WL_M−1 and select gate lines SGD and SGS are connected to the row control circuit 3.

In the case of two-bits-per-cell where two bits of data are stored in one memory cell MC, data stored in the plurality of memory cells MC connected to one word line WL configures two pages (an upper page UPPER and a lower page LOWER) of data.

One block BLK is formed by the plurality of NAND cell units NU sharing the word lines WL. The one block BLK forms a single unit of a data erase operation. The number of word lines WL in one block BLK in one memory cell array 1 is M, hence, in the case of two bits per cell, the number of pages in one block is M×2.

Configuration of Memory Cell MC and Select Gate Transistors S1 and S2

Figure 3:
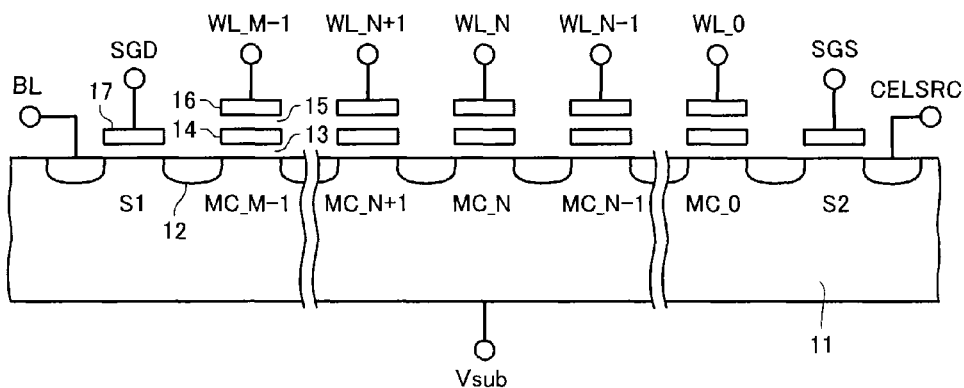
FIG. 3 is a schematic view of part of same memory cell array.

FIG. 3 shows schematically a cross-sectional structure of the memory cells MC_0~MC_M−1 and the select gate transistors S1 and S2. As shown in FIG. 3, an n type diffusion layer 12 is formed in a p type well 11 formed in a substrate, the n type diffusion layer 12 functioning as a source and a drain of a MOSFET configuring the memory cell MC. In addition, a floating gate (FG) 14 functioning as a charge accumulation layer is formed on the well 11 via a tunnel insulating film 13, and a control gate (CG) 16 is formed on this floating gate 14 via an inter-gate insulating film 15. The control gate 16 configures the word line WL. Moreover, the select gate transistors S1 and S2 each include a select gate 17 on the well 11 via a gate insulating film. The select gates 17 configure the select gate lines SGS and SGD. The memory cells MC and the select gate transistors S1 and S2 are NAND-connected in a form where those adjacent to each other share the drain and the source.

Write Operation

Figure 4:
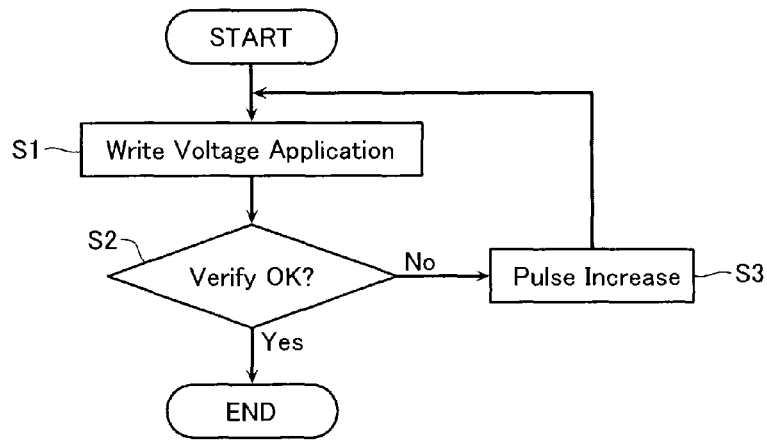
FIG. 4 is a flowchart for explaining a write operation in same nonvolatile semiconductor memory device.

Next, a write operation according to the present embodiment is described. FIG. 4 is a flowchart showing an example of the write operation according to the present embodiment.

In the write operation according to the present embodiment, voltage of the bit line is set to a ground voltage and a write pulse is applied to a selected word line WL_k (step S1). Next, a write verify operation for confirming whether a threshold of a selected memory cell MC_k has reached a specified value or not is performed (step S2). If it is judged in the write verify operation that write of the selected memory cell MC_k has not been completed, a voltage of the write pulse is raised (step S3) and application of the write pulse and the write verify operation are once again repeated. Regarding the selected memory cell MC_k for which write has been completed, additional write is prevented by raising a voltage of the bit line BL and rendering the select gate transistor S1 in an off state to boost a channel voltage of the selected memory cell MC_k.

Figure 6A:
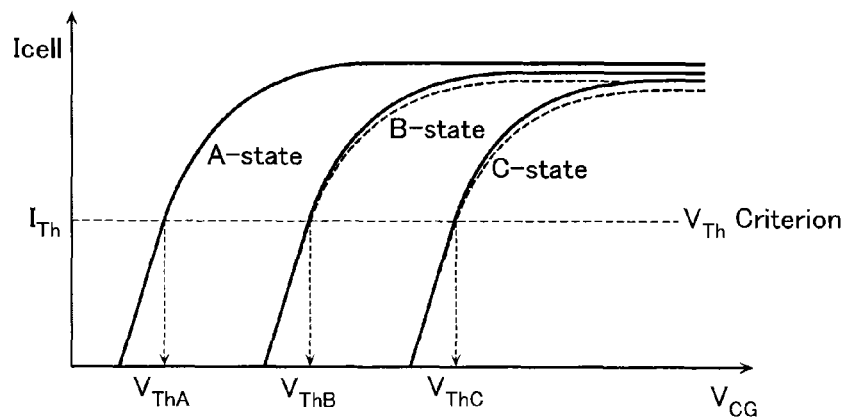
FIG. 6A is a graph showing a relationship between a gate voltage and a cell current of a memory cell MC during same write verify operation.
Figure 6B:
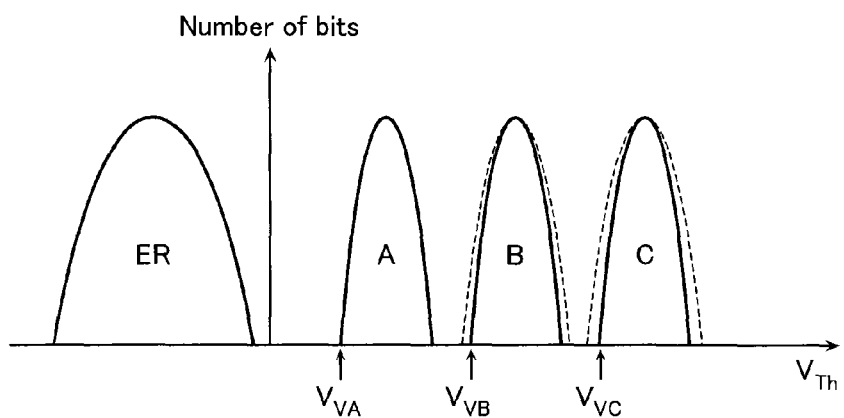
FIG. 6B is a histogram showing a threshold distribution of the memory cell MC after the write verify operation.

Note that in the present embodiment, two-bits-per-cell is adopted, and as shown in FIG. 6B, four forms of write data (data ER, A, B, and C) exist. Additionally, the write verify operation for data ER is omitted in this embodiment. Therefore, application of three forms of verify voltages ($V_{VA}$, $V_{VB}$, and $V_{VC}$) is performed in step S2 in order to perform a read for each forms of the write data. For example, when data A is written to the memory cell MC_k, in step S2, the verify voltage $V_{VA}$ is applied to the control gate 16 of this selected memory cell MC_k to confirm whether a current flows between the source and the drain of the selected memory cell MC_k or not. Now, when write of the selected memory cell MC_k has been completed, the current flowing between the source and the drain of the selected memory cell MC_k decreases. On the other hand, when write of the selected memory cell MC_k has not been completed, that is, when the threshold of the selected memory cell MC_k is less than the verify voltage $V_{VA}$, a current of a certain value or more flows between the source and the drain of the selected memory cell MC_k.

Figure 5:
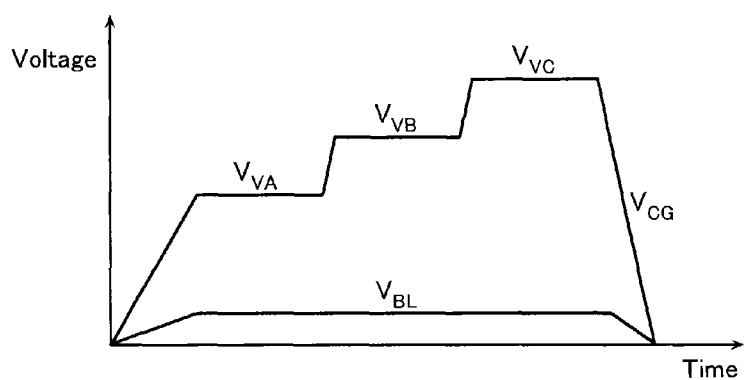
FIG. 5 is a voltage waveform chart for explaining a write verify operation in a nonvolatile semiconductor memory device according to a comparative example.

Write Verify Operation in Nonvolatile
Semiconductor Memory Device According to
Comparative Example Next, prior to a more detailed description of the write verify operation in the nonvolatile semiconductor memory device according to the present embodiment, a write verify operation in a nonvolatile semiconductor memory device according to a comparative example is described. FIG. 5 is a voltage waveform chart showing a control gate voltage $V_{CG}$ and a bit line voltage $V_{BL}$ in the write verify operation in the nonvolatile semiconductor memory device according to the comparative example.

In the comparative example, the bit line voltage $V_{BL}$ is fixed to a substantially constant value, and the control gate voltage $V_{CG}$ is set to the verify voltage $V_{VA}$. Now, of the memory cells MC written with data A, those where a cell current $I_{cell}$ flowing between the source and the drain has not reached a threshold current $I_{Th}$ are judged to have had write completed, and those where the cell current $I_{cell}$ has reached the threshold current $I_{Th}$ are judged to have not had write completed yet. Similarly also for the memory cells MC written with data B and data C, the verify operation is performed with changing a voltage applied as the control gate voltage $V_{CG}$. As shown in FIG. 5, the control gate voltage $V_{CG}$ is changed to the verify voltages $V_{VB}$ and $V_{VC}$, according to data to be written to the memory cell MC. Note that the bit line voltage $V_{BL}$ according to the comparative example is a constant value regardless of values of the verify voltages $V_{VA}$, $V_{VB}$, and $V_{VC}$.

FIG. 6A is a graph showing a relationship between the control gate voltage $V_{CG}$ and the cell current $I_{cell}$ of the memory cell MC storing data A, B, and C, and FIG. 6B is a histogram showing the threshold distributions of the memory cell MC storing data ER, A, B, and C. As shown in FIG. 6A, there is a tendency for a saturation current of the memory cell MC to decrease and an S factor to increase, the larger the threshold of the data stored in the memory cell MC. Furthermore, as shown by the dotted lines in FIG. 6A, there is a tendency for the saturation current of the memory cell MC to decrease and the S factor to increase, as the number of times of write/erase of the memory cell MC increases. Due to such tendencies, when the saturation current of the memory cell MC has approached the threshold current $I_{Th}$ more than a certain degree, variation in on/off ratio of the memory cell MC increases and variation in the control gate voltage $V_{CG}$ when verify is completed increases. Therefore, as shown by the dotted lines in FIG. 6B, an upper end of the distribution of the threshold voltage $V_{Th}$ of the memory cell MC shifts to a higher voltage side so that the distribution broadens.

Moreover, a position of a lower end of the distribution of the threshold voltage $V_{Th}$ of the memory cell MC can be controlled to a certain extent by the verify voltages $V_{VA}$, $V_{VB}$, and $V_{VC}$. However, when a spacing between fellow memory cells MC narrows more than a certain degree, there is a possibility that the threshold voltage $V_{Th}$ of the memory cell MC is greatly affected by peripheral memory cells MC, particularly by capacitive coupling of floating gates of the peripheral memory cells MC. Specifically, it tends to become easier to write to a write-target selected memory cell MC in the case where write to the memory cell MC adjacent in the word line WL direction is completed, compared to in the case where the adjacent memory cell MC is in the middle of write (because the channel of the adjacent memory cell is in a ground state). This is because a channel of the adjacent memory cell MC is boosted when write to the adjacent memory cell MC has been completed and this raises a voltage of the floating gate of the adjacent memory cell MC. This means that, in spite of being in a state where a certain charge amount has not been accumulated in the floating gate, it is judged that the certain charge amount has been accumulated and a target threshold state has been reached. As shown by the dotted lines in FIG. 6B, this misjudgment occurs more frequently when the target threshold state of a memory cell MC is higher because write of more adjacent memory cells MC has been completed. Therefore, the higher the target threshold state of a memory cell MC is, the more the lower end of the threshold distribution shifts to a lower voltage side so that the threshold distribution broadens.

Figure 7:
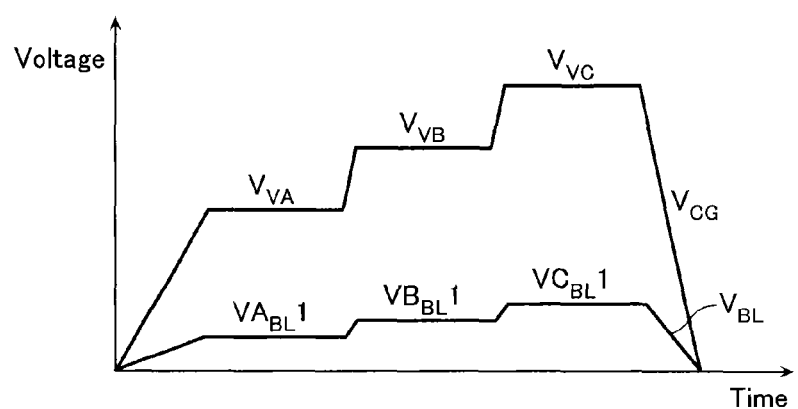
FIG. 7 is a voltage waveform chart for explaining a write verify operation in the nonvolatile semiconductor memory device according to the first embodiment.
Figure 8A:
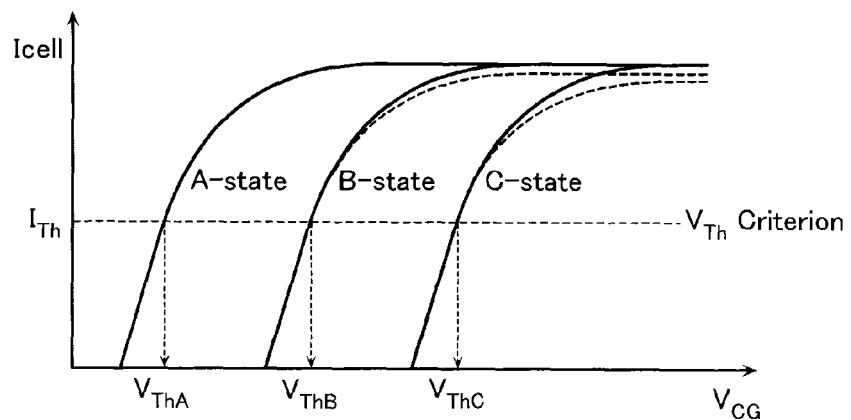
FIG. 8A is a graph showing a relationship between a gate voltage and a cell current of a memory cell MC during same write verify operation.
Figure 8B:
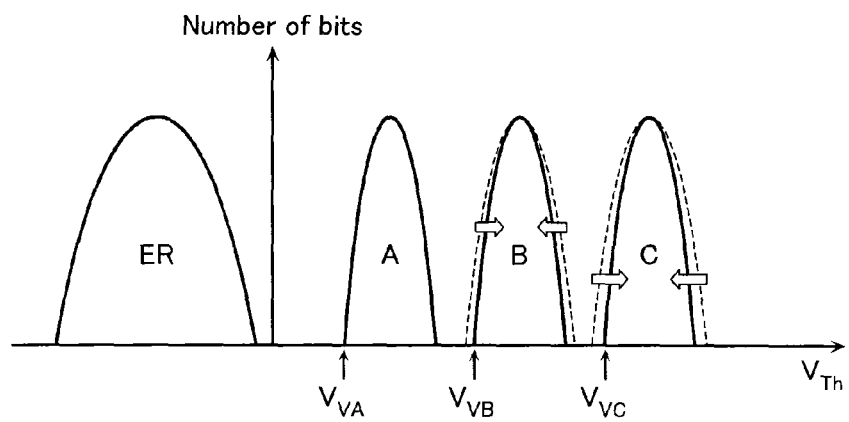
FIG. 8B is a histogram showing a threshold distribution of the memory cell MC after the write verify operation.

Write Verify Operation in Nonvolatile
Semiconductor Memory Device According to First
Embodiment Next, operation of the nonvolatile semiconductor memory device according to the present embodiment is described. FIG. 7 is a voltage waveform chart showing the control gate voltage $V_{CG}$ and the bit line voltage $V_{BL}$ during the write verify operation in the nonvolatile semiconductor memory device according to the present embodiment. In addition, FIG. 8A is a graph showing a relationship between the control gate voltage $V_{CG}$ and the cell current $I_{cell}$ of the memory cell MC storing data A, B, and C, and FIG. 8B is a histogram showing the threshold distributions of the memory cell MC storing data ER, A, B, and C. As shown in FIG. 7, during the write verify operation in the present embodiment, not only the control gate voltage $V_{CG}$ but also the bit line voltage $V_{BL}$ is changed according to determination-target data. More specifically, corresponding to the selected word line WL being applied with the sequentially increasing verify voltages $V_{VA}$, $V_{VB}$, and $V_{VC}$ as the control gate voltage $V_{CG}$, the bit line voltage $V_{BL}$ is also sequentially increased in the manner of $VA_{BL}1$, $VB_{BL}1$, and $VC_{BL}1$. When the bit line voltage $V_{BL}$ is increased, the saturation current of the memory cell MC also increases, hence, as shown by the solid lines in FIG. 8A, the saturation current can be brought close to a constant target value, regardless of write data. In addition, the S factor where the threshold level is high is also improved, hence variation in on/off ratio is also suppressed. As a result, as shown in FIG. 8B, the higher the threshold, the more shift of the upper end of the threshold distribution broadening the distribution can be suppressed. Furthermore, by adjusting the bit line voltages $VA_{BL}1$, $VB_{BL}1$, and $VC_{BL}1$, the cell current of a write-incomplete memory cell MC can be increased, whereby, as shown in FIG. 8B, shift of the lower end of the threshold distribution to the lower voltage side can be suppressed.

Note that in view of the fact that a drop in the saturation current occurs with an increase in the number of times of write/erase, it is also possible for the increase in the number of times of write/erase or the drop in the saturation current to be detected, to adjust the bit line voltages during the write verify operation $VA_{BL}1$, $VB_{BL}1$, and $VC_{BL}1$ in accordance with those increase and drop. Note that this controlling method of the bit line voltages can be also applied to the embodiments below. Moreover, in the present embodiment, a potential difference between the source and the drain of the memory cell MC is adjusted by performing adjustment of the bit line voltage, but in some cases it is also possible to adjust the potential difference between the source and the drain of the memory cell MC by adjustment of a source voltage. Furthermore, in view of manufacturing error margin, and so on, adjustment is also possible on, for example, a block BLK basis or bit line BL basis. These points too may be similarly applied to the embodiments below.

Figure 9:
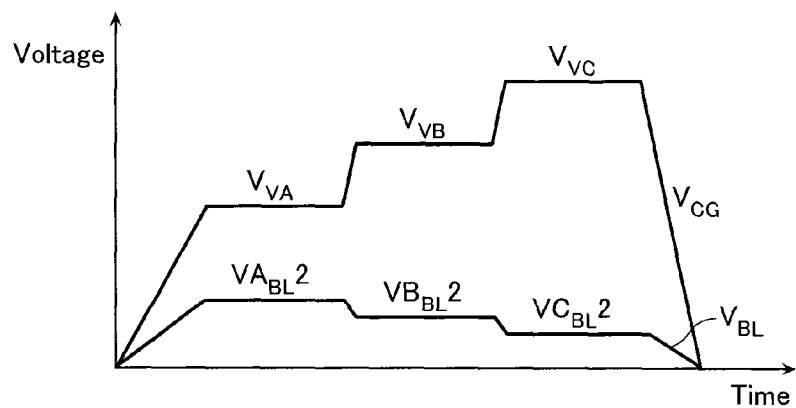
FIG. 9 is a voltage waveform chart for explaining a write verify operation in a nonvolatile semiconductor memory device according to a second embodiment.
Figure 10A:
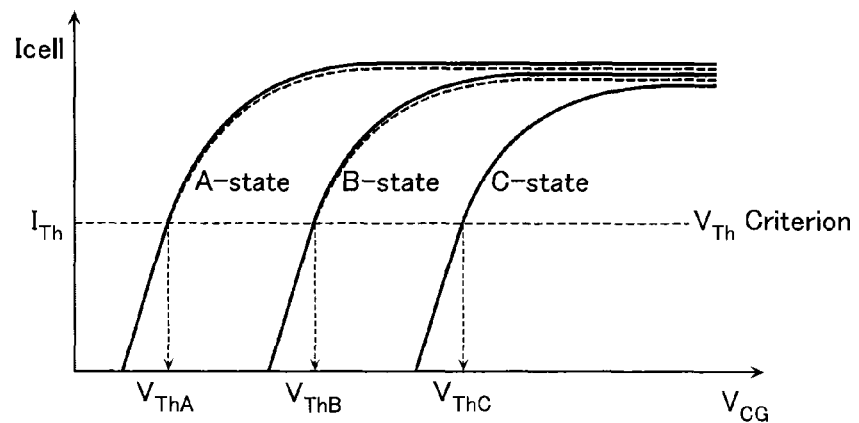
FIG. 10A is a graph showing a relationship between a gate voltage and a cell current of a memory cell MC during same write verify operation.
Figure 10B:
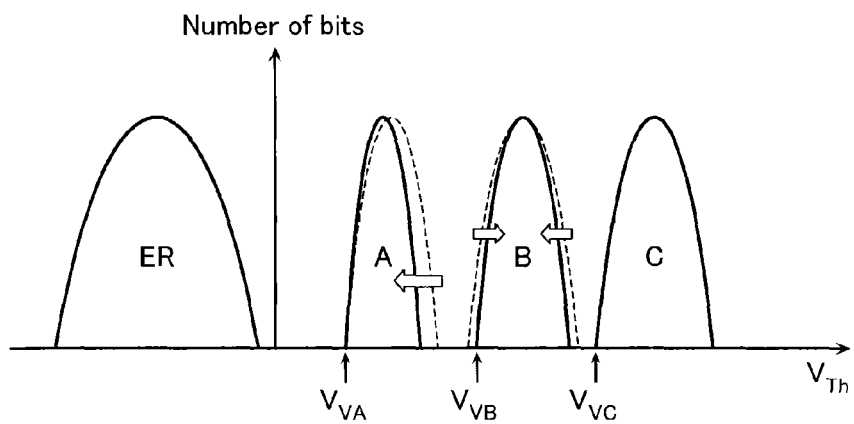
FIG. 10B is a histogram showing a threshold distribution of the memory cell MC after the write verify operation.

Operation in Nonvolatile Semiconductor Memory Device According to Second Embodiment Next, an operation in a nonvolatile semiconductor memory device according to a second embodiment is described. FIG. 9 is a voltage waveform chart showing the control gate voltage $V_{CG}$ and the bit line voltage $V_{BL}$ during a write verify operation in the nonvolatile semiconductor memory device according to the present embodiment. In addition, FIG. 10A is a graph showing a relationship between the control gate voltage $V_{CG}$ and the cell current $I_{cell}$ of the memory cell MC storing data A, B, and C, and FIG. 10B is a histogram showing the threshold distributions of the memory cell MC storing data ER, A, B, and C. The first embodiment was configured such that corresponding to the selected word line WL being applied with the sequentially increasing verify voltages $V_{VA}$, $V_{VB}$, and $V_{VC}$ as the control gate voltage $V_{CG}$, the bit line voltage $V_{BL}$ is also sequentially increased in the manner of $VA_{BL}1$, $VB_{BL}1$, and $VC_{BL}1$. In contrast, as shown in FIG. 9, in the present embodiment, corresponding to the selected word line WL being applied with the sequentially increasing verify voltages $V_{VA}$, $V_{VB}$, and $V_{VC}$ as the control gate voltage $V_{CG}$, the bit line voltage $V_{BL}$ is sequentially decreased in the manner of $VA_{BL}2$, $VB_{BL}2$, and $VC_{BL}2$.

In the case of this embodiment, as shown in FIG. 10A, the result is rather that a difference in saturation current between each data broadens, but as shown in FIG. 10B, variation in the threshold of the memory cell MC storing data A and B decreases. In addition, the write verify operation is performed in order from data A of low threshold through data B and C, in the present embodiment. Accordingly, because the voltage of the bit line BL is set high during the write verify operation for data A, a time for charging the bit line BL during verify of data B and data C is reduced, thereby leading also to speeding-up of the write verify operation and a lowering of power consumption.

Figure 11:
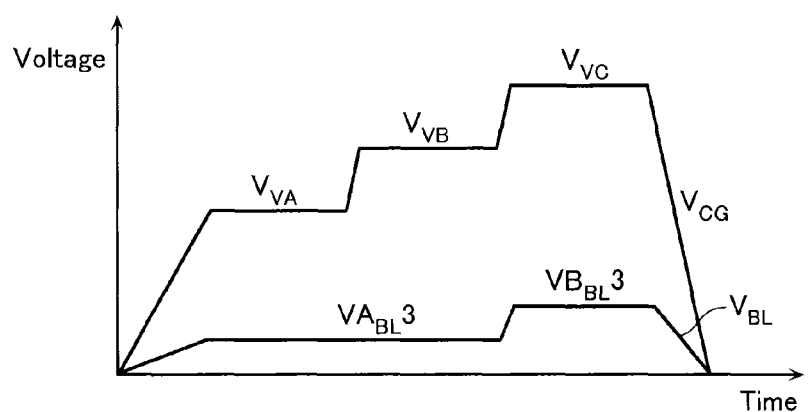
FIG. 11 is a voltage waveform chart for explaining a write verify operation in a nonvolatile semiconductor memory device according to a third embodiment.
Figure 12A:
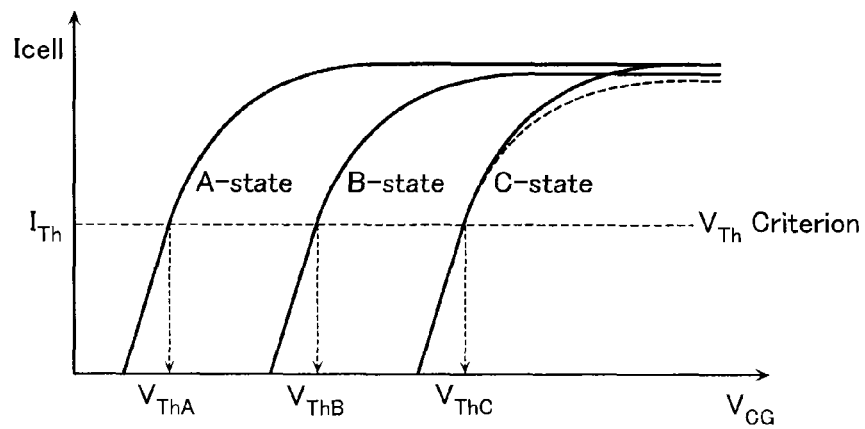
FIG. 12A is a graph showing a relationship between a gate voltage and a cell current of a memory cell MC during same write verify operation.
Figure 12B:
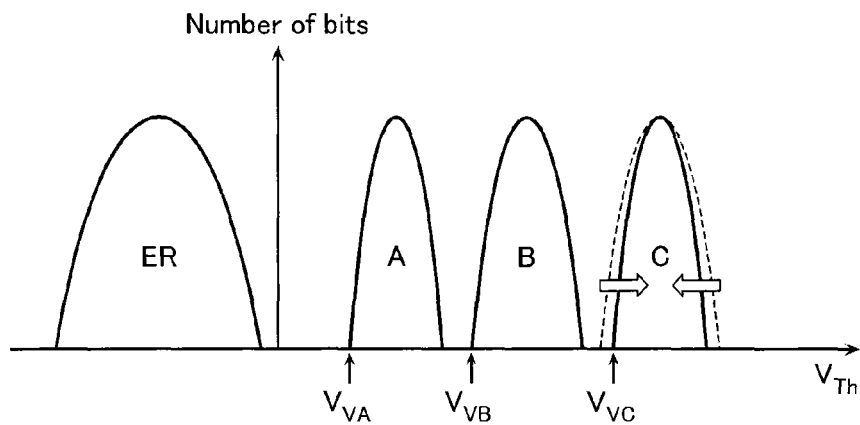
FIG. 12B is a histogram showing a threshold distribution of the memory cell MC after the write verify operation.

Operation in Nonvolatile Semiconductor Memory Device According to Third Embodiment Next, an operation in a nonvolatile semiconductor memory device according to a third embodiment is described. FIG. 11 is a voltage waveform chart showing the control gate voltage $V_{CG}$ and the bit line voltage $V_{BL}$ during a write verify operation in the nonvolatile semiconductor memory device according to the present embodiment. In addition, FIG. 12A is a graph showing a relationship between the control gate voltage $V_{CG}$ and the cell current $I_{cell}$ of the memory cell MC storing data A, B, and C, and FIG. 12B is a histogram showing the threshold distributions of the memory cell MC storing data ER, A, B, and C. In the first and second embodiments, different bit line voltages $VA_{BL}1$ and $VA_{BL}2$, $VB_{BL}1$ and $VB_{BL}2$, and $VC_{BL}1$ and $VC_{BL}2$ were respectively set for all of the data A, B, and C, but it is not necessarily required to respectively employ different magnitudes of bit line voltages for verify of data having different thresholds, in a corresponding manner. For example, a different bit line voltage may be employed only for data whose variation of threshold distribution is most desired to reduce. In the present embodiment, as shown in FIG. 11, a common bit line voltage $VA_{BL}3$ is employed in verify of data A and B, and a bit line voltage $VB_{BL}3$ which is higher than the bit line voltage $VA_{BL}3$ is employed in verify of data C. Since the above-mentioned problem of the difference between the threshold current $I_{Th}$ and the saturation current and problem of capacitive coupling are thought to occur most easily in a memory cell MC where data C is stored, the method according to the present embodiment, by correcting only the saturation current for data C as shown in FIG. 12A, sometimes enables variation in the threshold voltage to be sufficiently reduced as shown in FIG. 12B. Moreover, in the present embodiment, because the cell current $I_{cell}$ can be suppressed more compared to in the first embodiment and the second embodiment, stress on the memory cell MC can be reduced and a lifetime of the memory cell MC can be extended. Furthermore, because kinds of bit line voltages used can be reduced compared to in the first embodiment and the second embodiment, a configuration of the control circuit such as the voltage generating circuit 10 or column control circuit 2 can be simplified.

Figure 13:
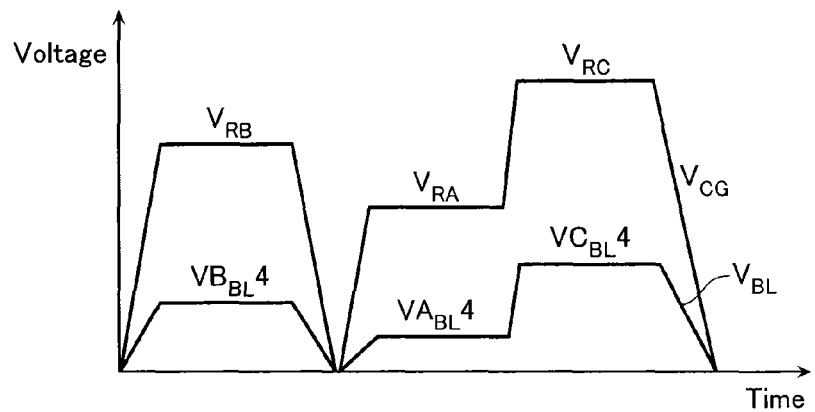
FIG. 13 is a voltage waveform chart for explaining a read operation in a nonvolatile semiconductor memory device according to a fourth embodiment.
Figure 14A:
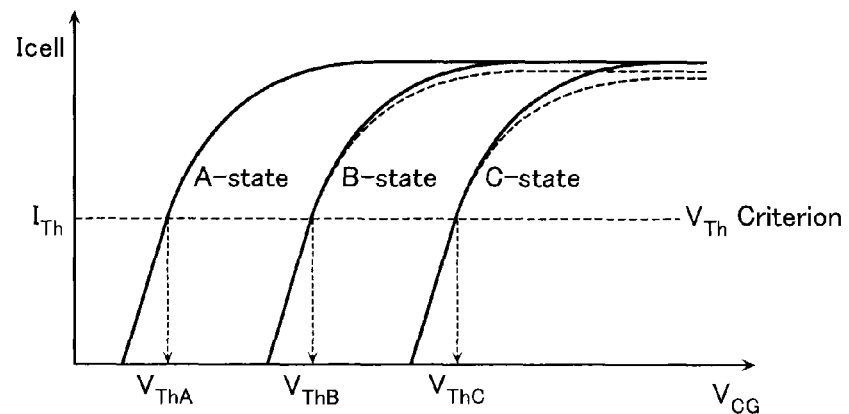
FIG. 14A is a graph showing a relationship between a gate voltage and a cell current of a memory cell MC during same read operation.
Figure 14B:
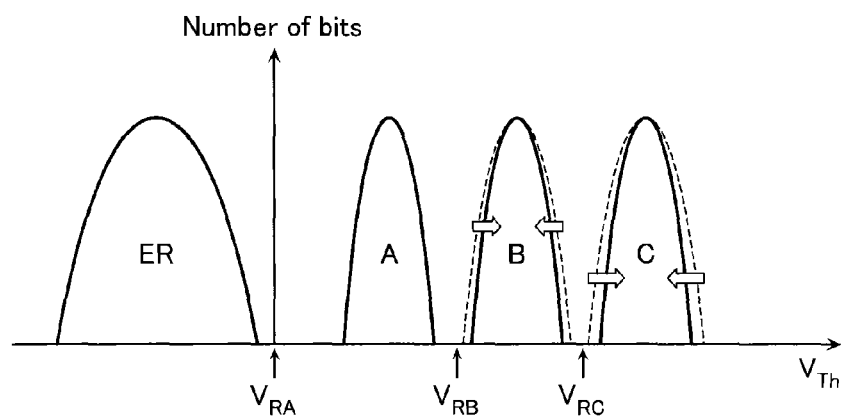
FIG. 14B is a histogram showing a threshold distribution of the memory cell MC.

Operation in Nonvolatile Semiconductor Memory Device According to Fourth Embodiment Next, an operation in a nonvolatile semiconductor memory device according to a fourth embodiment is described. FIG. 13 is a voltage waveform chart showing the control gate voltage $V_{CG}$ and the bit line voltage $V_{BL}$ during a read operation in the nonvolatile semiconductor memory device according to the present embodiment. In addition, FIG. 14A is a graph showing a relationship between the control gate voltage $V_{CG}$ and the cell current $I_{cell}$ of the memory cell MC storing data A, B, and C, and FIG. 14B is a histogram showing the threshold distributions of the memory cell MC storing data ER, A, B, and C. In the first through third embodiments, the bit line voltage during the write verify operation was adjusted for verify-target data A, B, and C, thereby lowering variation in the threshold distributions. However, correction of read data by adjustment of the potential difference between the source and the drain of the memory cell MC may be applied also to the read operation of data. As this correction of read data decreases misjudgment of read data, variation in read threshold is suppressed.

In the present embodiment, the bit line voltage during the read operation of data is adjusted for read operation-target data A, B, and C. Moreover, in the present embodiment, as shown in FIG. 13, the larger a read voltage, the more the bit line voltage is also increased. That is, corresponding to the selected word line WL being sequentially applied with read voltages $V_{RB}$, $V_{RA}$, and $V_{RC}$ (where $V_{RA}<V_{RB}<V_{RC}$) as the control gate voltage $V_{CG}$, the bit line voltage is sequentially changed in the manner of $VB_{BL}4$, $VA_{BL}4$, and $VC_{BL}4$ (where $VA_{BL}4<VB_{BL}4<VC_{BL}4$). Furthermore, it might be considered that as shown in FIG. 14A, the bit line voltages $VA_{BL}4$, $VB_{BL}4$, and $VC_{BL}4$ employed in the read operation are set so as to cancel out the differences in the saturation current according to the read operation-target data. Furthermore, adjustment of the bit line voltages $VA_{BL}4$, $VB_{BL}4$, and $VC_{BL}4$ makes it possible to reduce also effects of capacitive coupling between adjacent memory cells MC. Therefore, in the present embodiment, as shown in FIG. 14B, setting the bit line voltage in this way makes it possible to reduce incorrect read and reduce variation in a read threshold voltage.

A read method according to the present embodiment, by combination with the verify method according to the first embodiment, allows operating points of the memory cell MC during the write operation and during the read operation to be brought closer to each other, which is thought to further enable reliability of the nonvolatile semiconductor memory device to be improved. In this case, the bit line voltages $VA_{BL}1$ and $VA_{BL}4$, $VB_{BL}1$ and $VB_{BL}4$, and $VC_{BL}1$ and $VC_{BL}4$ employed during write verify and during the read operation for data A, B, and C may be perfectly matched respectively. However, it is also possible to configure the nonvolatile semiconductor memory device such that, even when the bit line voltages $VB_{BL}1$ and $VC_{BL}1$ have been increased during write verify, the bit line voltages $VB_{BL}4$ and $VC_{BL}4$ is set to voltages less than increased bit line voltages $VB_{BL}1$ and $VC_{BL}1$ during the read operation. As a result, the problem of the lower end of a high level threshold distribution shifting to the lower voltage side due to capacitive coupling with a boosted adjacent memory cell MC during the write operation can be solved. Note that the read operation method according to the present embodiment may also be combined with the verify operation methods according to the second or third embodiments.

Figure 15:
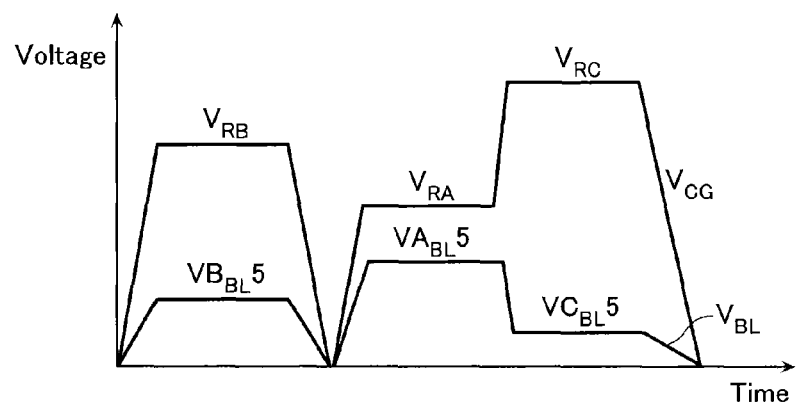
FIG. 15 is a voltage waveform chart for explaining a read operation in a nonvolatile semiconductor memory device according to a fifth embodiment.
Figure 16A:
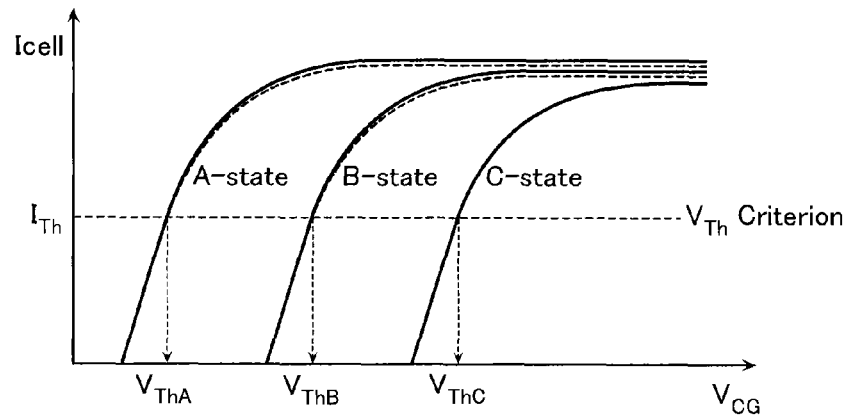
FIG. 16A is a graph showing a relationship between a gate voltage and a cell current of a memory cell MC during same read operation.
Figure 16B:
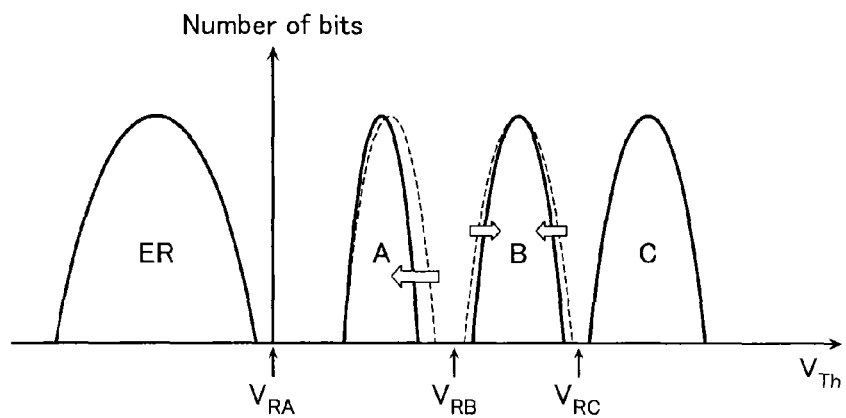
FIG. 16B is a histogram showing a threshold distribution of the memory cell MC.

Operation in Nonvolatile Semiconductor Memory Device According to Fifth Embodiment Next, an operation in a nonvolatile semiconductor memory device according to a fifth embodiment is described. FIG. 15 is a voltage waveform chart showing the control gate voltage $V_{CG}$ and the bit line voltage $V_{BL}$ during a read operation in the nonvolatile semiconductor memory device according to the present embodiment. In addition, FIG. 16A is a graph showing a relationship between the control gate voltage $V_{CG}$ and the cell current $I_{cell}$ of the memory cell MC storing data A, B, and C, and FIG. 16B is a histogram showing the threshold distributions of the memory cell MC storing data ER, A, B, and C. In the present embodiment, as shown in FIG. 15, the smaller the read voltage, the more the bit line voltage is increased. That is, corresponding to the selected word line WL being sequentially applied with the read voltages $V_{RB}$, $V_{RA}$, and $V_{RC}$ (where $V_{RA} < V_{RB} < V_{RC}$) as the control gate voltage $V_{CG}$, the bit line voltage is sequentially changed in the manner of $VB_{BL}5$, $VA_{BL}5$, and $VC_{BL}5$ (where $VA_{BL}5 > VB_{BL}5 > VC_{BL}5$). In this case, as shown in FIG. 16A, the result is rather that a difference in saturation current between each data broadens, but as shown in FIG. 16B, when for example it is desired to reduce the threshold distribution for data A and B, incorrect read of the memory cell MC is reduced. Moreover, in the present embodiment, read of data B which is read of the lower page is performed and then read of data A and C which is read of the upper page is performed. Here, because the voltage of the bit line BL is set high during the read operation for data A, a time for charging the bit line BL during the read operation of data C is reduced, thereby leading also to speeding-up of the read operation and a lowering of power consumption.

Note that the read operation method according to the present embodiment, by being used in combination with the write verify method according to the second embodiment, and furthermore by matching the bit line voltages $VA_{BL}2$ and $VA_{BL}5$, $VB_{BL}2$ and $VB_{BL}5$, and $VC_{BL}2$ and $VC_{BL}5$ used during write verify and during the read operation, matches operating points during write verify and during the read operation, which is thought to further enable reliability of the nonvolatile semiconductor memory device to be improved. However, similarly to in the case of the fourth embodiment, it is also possible to provide a difference in bit line voltages during write verify and during the read operation when a difference occurs in data read during the write verify operation and during the read operation. Moreover, the read operation according to the present embodiment may of course also be combined with the verify operations according to the first or third embodiments.

Figure 17:
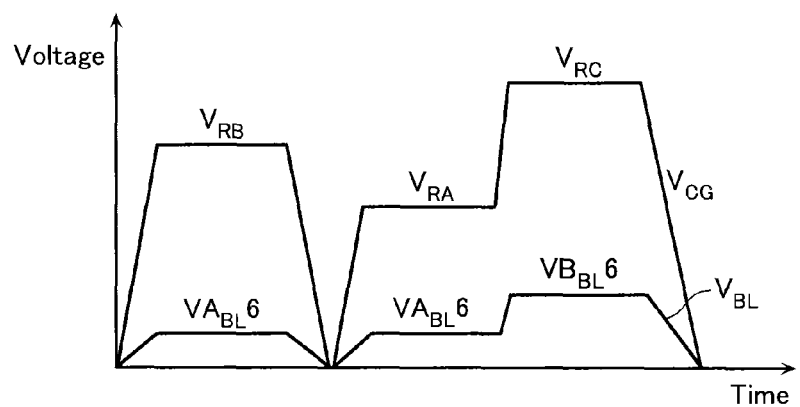
FIG. 17 is a voltage waveform chart for explaining a read operation in a nonvolatile semiconductor memory device according to a sixth embodiment.
Figure 18A:
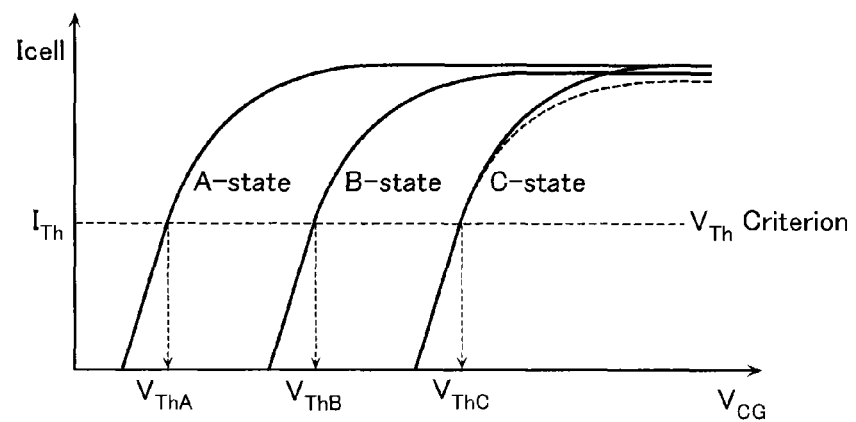
FIG. 18A is a graph showing a relationship between a gate voltage and a cell current of a memory cell MC during same read operation.
Figure 18B:
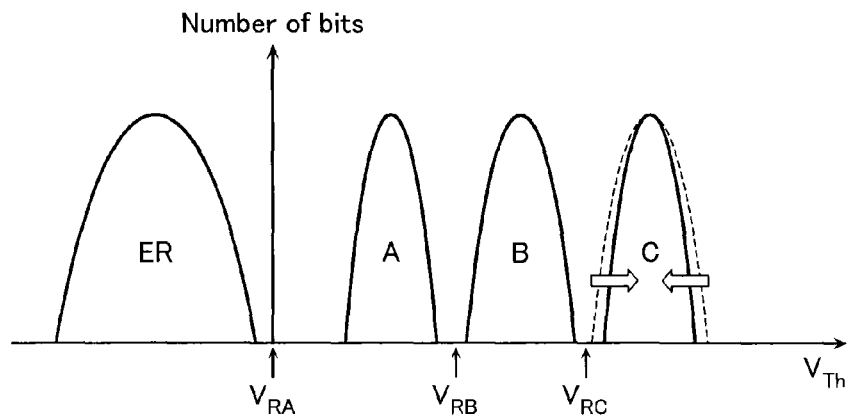
FIG. 18B is a histogram showing a threshold distribution of the memory cell MC.

Operation in Nonvolatile Semiconductor Memory Device According to Sixth Embodiment Next, an operation in a nonvolatile semiconductor memory device according to a sixth embodiment is described. FIG. 17 is a voltage waveform chart showing the control gate voltage $V_{CG}$ and the bit line voltage $V_{BL}$ during a read operation in the nonvolatile semiconductor memory device according to the present embodiment. In addition, FIG. 18A is a graph showing a relationship between the control gate voltage $V_{CG}$ and the cell current $I_{cell}$ of the memory cell MC storing data A, B, and C, and FIG. 18B is a histogram showing the threshold distributions of the memory cell MC storing data ER, A, B, and C. In the present embodiment, as shown in FIG. 17, a different bit line voltage $VB_{BL}6$ is employed only for the read operation of data whose incorrect read is most desired to reduce, for example, data C, and a common bit line voltage $VA_{BL}6$ is employed for the read operation of data A and B. As a result, correcting only the saturation current for data C as shown in FIG. 18A can enable variation in the threshold voltage to be reduced to substantially the same degree as in the fourth embodiment as shown in FIG. 18B. Moreover, a configuration according to the present embodiment enables a lifetime of the memory cell MC to be extended more compared to the fourth embodiment and the fifth embodiment, and furthermore enables a configuration of the control circuit such as the voltage generating circuit 10 or column control circuit 2 to be simplified.

The read operation method according to the present embodiment is thought to operate in a more preferable manner by being combined with the write verify method according to the third embodiment and by matching the bit line voltages used. However, it is also possible to provide a difference in bit line voltages used during the read operation and during the write verify operation. Moreover, the read operation method according to the present embodiment may also be used in combination with the verify methods according to the first or second embodiments.

Other

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array comprising a plurality of memory cells that each include a control gate and a charge accumulation layer and that each are configured to have a threshold set to be included in any of a plurality of threshold distributions and thereby store multiple bits of data, the memory cell being connected between a bit line and a source line, and the control gate of the memory cell being connected to a word line; and
   a control circuit that, in at least one of a write verify operation and a read operation on a selected memory cell, applies to the word line a control gate voltage to determine the threshold of the selected memory cell, the control gate voltage having a plurality of values respectively corresponding to the plurality of threshold distributions, and sets a voltage between the bit line and the source line to which the selected memory cell is connected, based on the control gate voltage, wherein
   the control circuit sets the voltage between the bit line and the source line in the case of applying to the word line the control gate voltage for determining whether the threshold of the selected memory cell is included in a certain threshold distribution and thereby performs the read operation of the memory cell, same as the voltage between the bit line and the source line in the case of performing the write verify operation during write to the certain threshold distribution, and the larger the control gate voltage, the larger the control circuit sets the voltage between the bit line and the source line to which the selected memory cell is connected.

2. The nonvolatile semiconductor memory device according to claim 1, wherein
   the control circuit sets the voltage between the bit line and the source line to which the selected memory cell is connected when the control gate voltage is set to a certain value, larger than the voltage between the bit line and the source line to which the selected memory cell is connected when the control gate voltage is set to a value other than the certain value.

3. The nonvolatile semiconductor memory device according to claim 1, wherein
   the control circuit sets the voltage between the bit line and the source line further based on an increase in the number of times of write/erase of the memory cell array or a drop in a saturation current value of the memory cell.

4. The nonvolatile semiconductor memory device according to claim 1, wherein
   the memory cell is configured to have the threshold set to be included in any of n (n is an integer of 3 or more) forms of threshold distributions, and
   the control circuit, when reading data from the selected memory cell in at least one of the write verify operation and the read operation,
      is capable of setting the control gate voltage to n−1 forms based on the n forms of threshold distributions, and
      sets the voltage between the bit line and the source line to which the selected memory cell is connected to one of 2 through n−1 forms of voltages, based on the control gate voltage.

5. A method of controlling a nonvolatile semiconductor memory device, the nonvolatile semiconductor memory device comprising: a memory cell array comprising a plurality of memory cells that each include a control gate and a charge accumulation layer and that each are configured to have a threshold set to be included in any of a plurality of threshold distributions and thereby store multiple bits of data, the memory cell being connected between a bit line and a source line, and the control gate of the memory cell being connected to a word line; and a control circuit that applies a voltage to the memory cell array, the method comprising:
   in at least one of a write verify operation and a read operation on a selected memory cell, applying to the word line a control gate voltage to determine the threshold of the selected memory cell, the control gate voltage having a plurality of values respectively corresponded to the plurality of threshold distributions, and setting a voltage between the bit line and the source line to which the selected memory cell is connected, based on the control gate voltage; and
   detecting whether a value of a current flowing in the bit line is a certain value or more, or not, wherein
   the control circuit sets the voltage between the bit line and the source line in the case of applying to the word line the control gate voltage for determining whether the threshold of the selected memory cell is included in a certain threshold distribution and thereby performing the read operation of the memory cell, same as the voltage between the bit line and the source line in the case of performing the write verify operation during write to the certain threshold distribution, and the larger the control gate voltage, the larger the control circuit sets voltage between the bit line and the source line to which the selected memory cell is connected.

6. The method of controlling a nonvolatile semiconductor memory device according to claim 5, wherein
   the memory cell is configured to have the threshold set to be included in any of n (n is an integer of 3 or more) forms of threshold distributions, and
   the control circuit, when reading data from the selected memory cell in at least one of the write verify operation and the read operation,
   sets the control gate voltage to n−1 forms based on the n forms of threshold distributions, and
   sets the voltage between the bit line and the source line to which the selected memory cell is connected to one of 2 through n−1 forms of voltages, based on the control gate voltage.

7. The method of controlling a nonvolatile semiconductor memory device according to claim 5, wherein
   the control circuit sets the voltage between the bit line and the source line to which the selected memory cell is connected when the control gate voltage is set to a certain value, larger than the voltage between the bit line and the source line to which the selected memory cell is connected when the control gate voltage is set to a value other than the certain value.

* * * * *